(12) United States Patent
Nam et al.

(10) Patent No.: US 7,932,135 B1
(45) Date of Patent: Apr. 26, 2011

(54) METHOD OF MANUFACTURING THIN FILM TRANSISTOR ARRAY SUBSTRATE

(75) Inventors: Seunghee Nam, Paju-si (KR);
Taehyoung Moon, Gwangmyeong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/878,737

(22) Filed: Sep. 9, 2010

(30) Foreign Application Priority Data

Oct. 14, 2009  (KR) .................. 10-2009-0097711

(51) Int. Cl.
*H01L 21/00* (2006.01)
(52) U.S. Cl. ...................................... 438/149
(58) Field of Classification Search ............. 438/29, 438/149; 257/59, 72; 349/42
See application file for complete search history.

(56) References Cited

U.S. PATENT DOCUMENTS

| | | | |
|---|---|---|---|
| 6,861,365 B2 | 3/2005 | Taussig et al. |
| 7,059,834 B2 | 6/2006 | Chlus et al. |
| 7,070,406 B2 | 7/2006 | Jeans |
| 7,202,179 B2 | 4/2007 | Taussig et al. |
| 7,291,564 B1 | 11/2007 | Jackson |
| 7,341,893 B2 | 3/2008 | Mei et al. |
| 7,521,313 B2 | 4/2009 | Mei |
| 7,541,227 B2 | 6/2009 | Mei et al. |
| 7,585,424 B2 | 9/2009 | Mei |

*Primary Examiner* — David Vu
*Assistant Examiner* — Shaun Campbell
(74) *Attorney, Agent, or Firm* — McKenna Long & Aldridge LLP

(57) ABSTRACT

Disclosed is a method of manufacturing a TFT array substrate having a reduced number of mask processes. The method includes sequentially depositing a first conductive material, a gate insulating layer, a semiconductor layer, and a second conductive material on a substrate, and forming a first resist pattern having three height levels on the second conductive material. The method further includes forming a gate line, a data line that crosses the gate line and has first and second slit units, a source electrode connected to the data line and having a third slit unit, and a drain electrode positioned opposite the source electrode with a channel interposed between the source electrode and the drain electrode and having a fourth slit unit, through a plurality of etching processes using the first resist pattern.

16 Claims, 7 Drawing Sheets

(A)  (B)

METHOD OF MANUFACTURING THIN FILM TRANSISTOR ARRAY SUBSTRATE

This application claims the benefit of Korea Patent Application No. 10-2009-0097711, filed on Oct. 14, 2009, which is incorporated by reference for all purposes as if fully set forth herein.

BACKGROUND OF THE INVENTION

1. Field of the Invention

The present invention relates to a method of manufacturing a thin film transistor array substrate. More particularly, the present invention relates to a method of manufacturing a thin film transistor array substrate having a reduced number of mask processes.

2. Discussion of the Related Art

A liquid crystal display adjusts light transmittance of liquid crystals using an electric field to thereby display an image. The liquid crystal display drives the liquid crystals by an electric field generated between a pixel electrode and a common electrode.

The liquid crystal display includes a thin film transistor (TFT) array substrate and a color filter array substrate that are positioned opposite each other and are attached to each other, a spacer that is positioned between the two array substrates to keep a cell gap between the two array substrates constant, and a liquid crystal layer filled in the cell gap.

The thin film transistor array substrate includes a plurality of signal lines, a plurality of thin film transistors, a plurality of pixel electrodes, and an alignment layer coated for an orientation of the liquid crystals. The color filter array substrate includes a color filter for a color representation, a black matrix for preventing a light leakage, a common electrode, and an alignment layer coated for an orientation of the liquid crystals.

The thin film transistor array substrate is typically manufactured using a plurality of mask processes including a semiconductor process. One mask process includes a large number of processes such as a thin film deposition process, a cleansing process, a photolithography process, an etching process, a photoresist peeling process, and a testing process. Thus, an increase in the number of mask processes results in an increase in the manufacturing cost of the liquid crystal display. Accordingly, an efforts to reduce the number of mask processes in the manufacture of the thin film transistor array substrate have been continuously made. The number of mask processes has recently been reduced to three (i.e., 3-mask process) through various processes such as a lift-off process.

However, the number of mask processes still needs to be reduced to be equal to or less than two (i.e., 2-mask process) so as to further reduce the manufacturing cost of the liquid crystal display.

SUMMARY OF THE INVENTION

Accordingly, the present invention is directed to a method of manufacturing a thin film transistor array substrate that substantially obviates one of more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

An advantage of the invention is to provide a method of manufacturing a thin film transistor array substrate having a reduced number of mask processes.

In one aspect, there is a method of manufacturing a thin film transistor array substrate, comprising sequentially depositing a first conductive material, a gate insulating layer, a semiconductor layer, and a second conductive material on a substrate; forming a first resist pattern having three height levels on the second conductive material; forming a gate line, a data line that crosses the gate line and has first and second slit units, a source electrode connected to the data line and having a third slit unit, and a drain electrode positioned opposite the source electrode with a channel interposed between the source electrode and the drain electrode and having a fourth slit unit, through a plurality of etching processes using the first resist pattern; depositing a passivation layer on the substrate, in which the first resist pattern is removed, and then forming a second resist pattern on the passivation layer; removing the second resist pattern and the passivation layer in a pixel region through an etching process using the second resist pattern; depositing a third conductive material on an entire surface of the substrate including the pixel region; and removing the second resist pattern and the third conductive material deposited on the remaining passivation layer through a lift-off process to pattern a pixel electrode; and forming a pixel electrode connected to the drain electrode in the pixel region.

In another aspect, the method of manufacturing a thin film transistor array substrate may be manufactured using an imprinting process and only one photomask.

It is to be understood that both the foregoing general description and the following detailed description are exemplary and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention examples of which are illustrated in the accompanying drawings.

Figure 1:
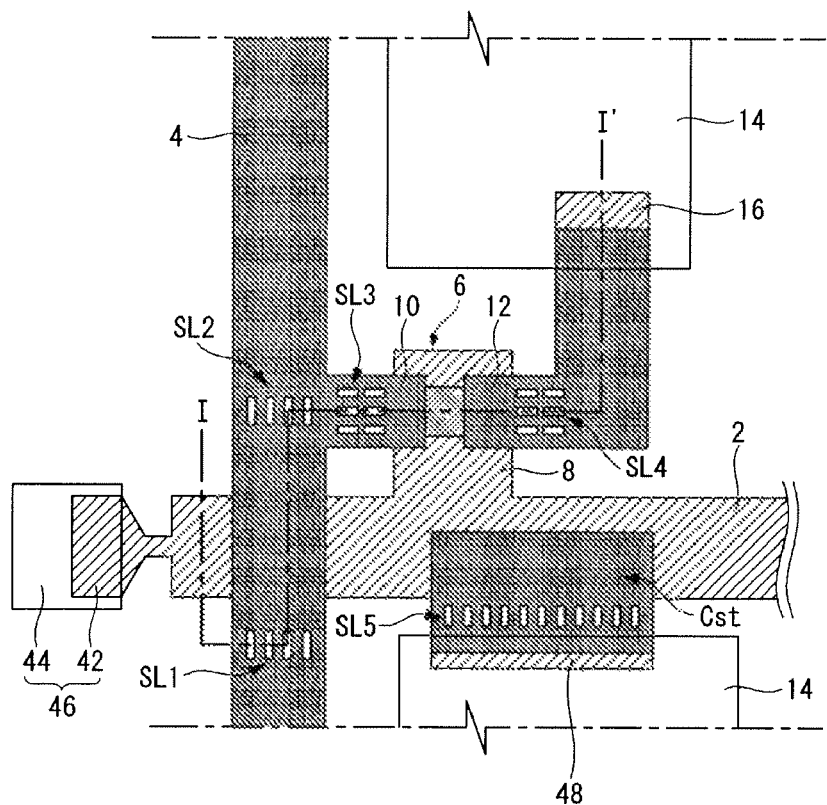
FIG. 1 is a plane view of a thin film transistor array substrate according to an exemplary embodiment of the invention.
Figure 2:
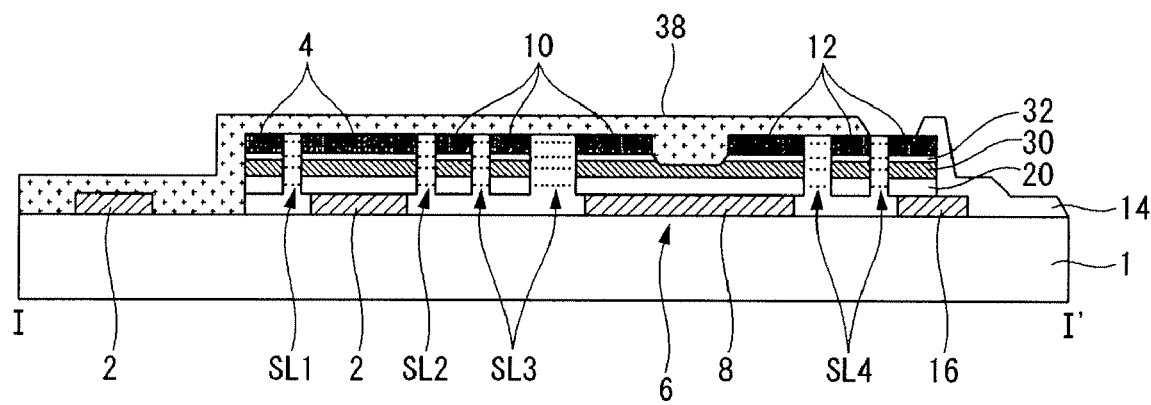
FIG. 2 is a cross-sectional view taken along line I-I' of FIG. 1.

FIG. 1 is a plane view of a thin film transistor array substrate according to an exemplary embodiment of the invention. FIG. 2 is a cross-sectional view taken along line I-I' of FIG. 1.

As shown in FIGS. 1 and 2, a thin film transistor array substrate according to an exemplary embodiment of the invention includes gate lines 2 and data lines 4 that cross each other on a lower substrate 1 with a gate insulating layer 20 interposed between the gate lines 2 and the data lines 4, a thin film transistor 6 formed at each crossing of the gate lines 2 and the data lines 4, pixel electrodes 14 formed in pixel regions defined by a cross structure of the gate lines 2 and the data lines 4, storage capacitors Cst overlapping the gate lines 2, a gate pad 46 connected to the gate lines 2, and a data pad (not shown) connected to the data lines 4. The thin film transistor array substrate further includes first and second slit units SL1 and SL2 formed around the crossings of the gate lines 2 and the data lines 4, third and fourth slit units SL3 and SL4 formed around channels of the thin film transistors 6, and a fifth slit unit SL5 formed around a formation area of the storage capacitor Cst.

The gate lines 2 supply a gate signal and the data lines 4 supply a data signal. The gate insulating layer 20 is interposed therebetween, to define the pixel regions based on the crossing structure of the gate line 2 and data line 4. The gate lines 2 are formed using a first conductive pattern (or a gate metal pattern), and the data lines 4 are formed using a second conductive pattern (or a source/drain metal pattern). The first conductive pattern underlying the data lines 4 is over-etched through the first and second slit units SL1 and SL2 and is electrically separated from the gate lines 2.

The thin film transistors 6 are switched on or off in response to a gate signal of the gate lines 2, and charge the pixel electrodes 14 with a data signal of the data lines 4. Each of the thin film transistors 6 includes a gate electrode 8 connected to the gate lines 2, a source electrode 10 connected to the data lines 4, and a drain electrode 12 connected to the pixel electrode 14. Each of the thin film transistors 6 further includes an active layer 30 and an ohmic contact layer 32. The active layer 30 overlaps the gate electrode 8 with the gate insulating layer 20 interposed between the gate electrode 8 and the active layer 30 and forms a channel between the source electrode 10 and the drain electrode 12. The ohmic contact layer 32 is formed on the active layer 30 excluding the channel from the active layer 30, so as to ohmic-contact the source electrode 10 and the drain electrode 12. The active layer 30 and the ohmic contact layer 32 overlap the data lines 4, a storage electrode (not shown), and a data pad lower electrode (not shown) formed using the second conductive pattern as well as the source electrode 10 and the drain electrode 12. The first conductive pattern underlying the source electrode 10 is over-etched through the third slit unit SL3 and is electrically separated from the gate electrode 8. The first conductive pattern underlying the drain electrode 12 is over-etched through the fourth slit unit SL4 and is electrically separated from the gate electrode 8.

A passivation layer 38 covers the thin film transistor 6, and protects the channels of the thin film transistor 6 from an external environment.

The pixel electrode 14 is formed in the pixel region and is connected by an edge to the drain electrode 12 of the thin film transistor 6. The pixel electrode 14 is formed using a third conductive pattern. The first conductive pattern is exposed under an end of the drain electrode 12 to be connected to the pixel electrode 14 to form an auxiliary connection pattern 16. The auxiliary connection pattern 16 prevents a disconnection from occurring between the pixel electrode 14 and the drain electrode 12 when the pixel electrode 14 and the drain electrode 12 are connected to each other. The pixel electrode 14 forms an electric field along with a common electrode (not shown) positioned opposite the pixel electrode 14. Liquid crystal molecules charged between an upper substrate (not shown) opposite the lower substrate 1 and the lower substrate 1 rotate by the electric field between the pixel electrode 14 and the common electrode. A transmittance of light transmitted by the pixel region varies depending on a rotation level of the liquid crystal molecules, thereby achieving a gray scale.

The storage capacitor Cst is formed by a partial overlap between the gate line 2 and the second conductive pattern with the gate insulating layer 20, the active layer 30, and the ohmic contact layer 32 interposed between the second conductive pattern and the gate lines 2. The storage capacitor Cst stably holds a pixel signal charged to the pixel electrode 14 until a next pixel signal is applied. In the storage capacitor Cst, the first conductive pattern 48 underlying the second conductive pattern is over-etched by the fifth slit unit SL5 and is electrically separated from the gate lines 2. The fifth slit unit SL5 prevents a short between the pixel electrode 14 and the gate lines 2 when the storage capacitor Cst is formed.

The gate pad 46 is connected to a gate driver (not shown) and supplies the gate signal to the gate line 2. The gate pad 46 includes a gate pad lower electrode 42 extending from the gate lines 2 and a gate pad upper electrode 44 directly connected to the gate pad lower electrode 42. The gate pad upper electrode 44 is formed using the third conductive pattern material.

The data pad is connected to a data driver (not shown) and supplies the data signal to the data lines 4. The data pad may include a data pad lower electrode extending from the data lines 4 and a data pad upper electrode directly connected to the data pad lower electrode. The data pad upper electrode may be formed using the third conductive pattern material.

A method of manufacturing the thin film transistor array substrate according to the exemplary embodiment of the invention is described below with reference to FIGS. 3A to 3I.

Figure 3A:
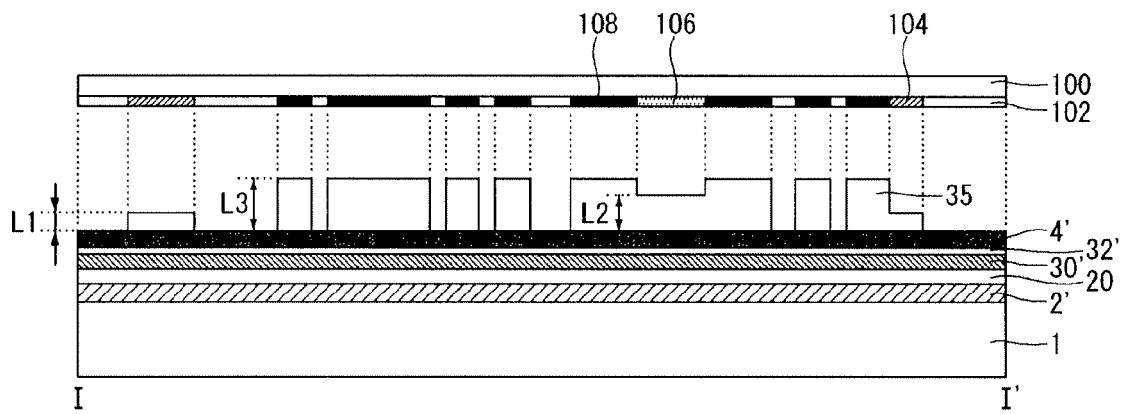
FIGS. 3A to 3I are cross-sectional views sequentially illustrating each stage of a method of manufacturing a thin film transistor array substrate according to an exemplary embodiment of the invention using a 2-mask process.

As shown in FIG. 3A, a first conductive material 2', the gate insulating layer 20, a semiconductor layer including an amorphous silicon layer 30' and an $n^+$-doped amorphous silicon layer 32', a second conductive material 4', and a first photoresist 35 are sequentially coated on the entire surface of the lower substrate 1 using a deposition method such as a plasma enhanced chemical vapor deposition (PECVD) method and a sputtering method. The first and second conductive materials 2' and 4' may be, for example, Cr, MoW, MoTi, Cr/Al, Cu, Al(Nd), Mo/Al, Mo/Al(Nd), and Cr/Al(Nd). Other materials may be used for the first and second conductive materials 2' and 4'. The gate insulating layer 20 may be formed of an inorganic insulating material such as SiNx and SiOx. Other materials may be used for the gate insulating layer 20.

Subsequently, the first photoresist is patterned through a photolithography process using a first mask 100 to form a first photoresist pattern 35 having three height levels. For this, the first mask 100 is implemented as a half tone mask including a transmission unit 102, a first transflective unit 104, a second transflective unit 106, and a shielding unit 108. In the first mask 100, an amount of light transmitted by the first transflective unit 104 is more than an amount of light transmitted by the second transflective unit 106. The first photoresist pattern corresponding to the transmission unit 102 is removed through an exposure process. A height level of the first photoresist pattern corresponding to the first transflective unit 104 is reduced to a first level L1 through the exposure process. A height level of the first photoresist pattern corresponding to the second transflective unit 106 is reduced to a second level L2 that is greater than the first level L1 through the exposure process. A height level of the first photoresist corresponding to the shielding unit 108 is held at a third level L3 in a deposition process. A removed portion of the first photoresist corresponding to the transmission unit 102 corresponds to an area of the lower substrate 1, on which the gate lines, the gate pad, the data lines, the data pad, the thin film transistors, and the storage capacitors are not formed, and a formation area of the first to fifth slit units SL1 to SL5. The first photoresist pattern 35 with the first height level L1 corresponds to a formation area of the gate line not overlapping a formation area of the data lines and a formation area of the storage capacitor, a formation area of the gate electrode not overlapping a formation area of the channel of the thin film transistor, a formation area of the auxiliary connection pattern, and a formation area of the gate pad lower electrode. The first photoresist pattern 35 with the second height level L2 corresponds to the formation area of the channel of the thin film transistor. The first photoresist pattern 35 with the third height level L3 corresponds to formation areas of the data lines, the source electrode, the drain electrode, and the storage capacitor.

Figure 3B:
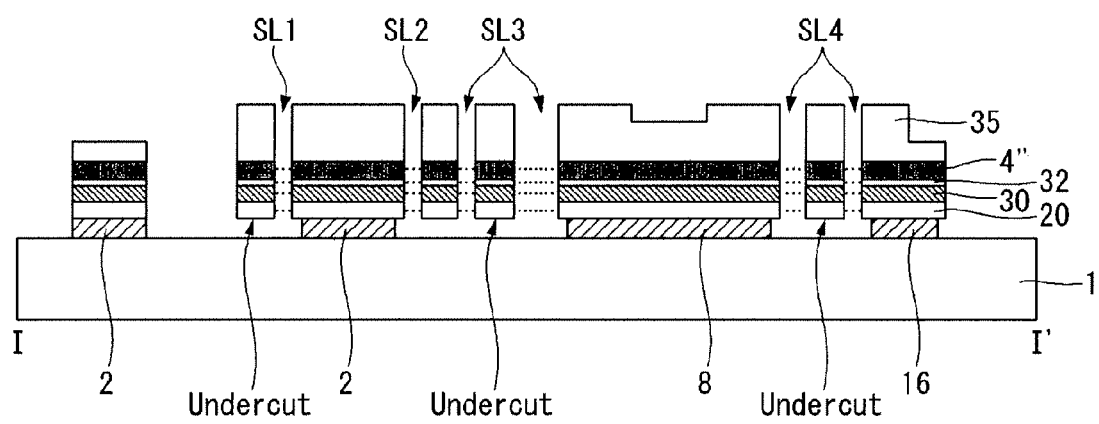

As shown in FIG. 3B, the second conductive material 4' is patterned through a first wet etching process using the first photoresist pattern 35, and then the n$^+$-doped amorphous silicon layer 32', the amorphous silicon layer 30', and the gate insulating layer 20 are simultaneously patterned through a first dry etching process using the first photoresist pattern 35. Subsequently, the first conductive material 2' is patterned through the first wet etching process using the first photoresist pattern 35. As a result, the first to fifth slit units SL1 to SL5 are formed in an area corresponding to the removed portion of the first photoresist, and the area of the lower substrate 1, on which the gate lines 2, the gate pad, the data lines, the data pad, the thin film transistor, and the storage capacitor are not formed, is exposed in the removed portion of the first photoresist. The first conductive material 2' is over-etched so as to have an undercut structure and is sufficiently removed around the first to fifth slit units SL1 to SL5. Further, a second conductive pattern group 4" including the data lines, the source electrode, the drain electrode forming an integral body along with the source electrode, and the data pad lower electrode is formed, a semiconductor pattern including the ohmic contact layer 32 and the active layer 30 is formed, and a first conductive pattern group including the gate lines 2, the gate electrode 8, the gate pad lower electrode, and the auxiliary connection pattern 16 is formed.

Figure 3C:
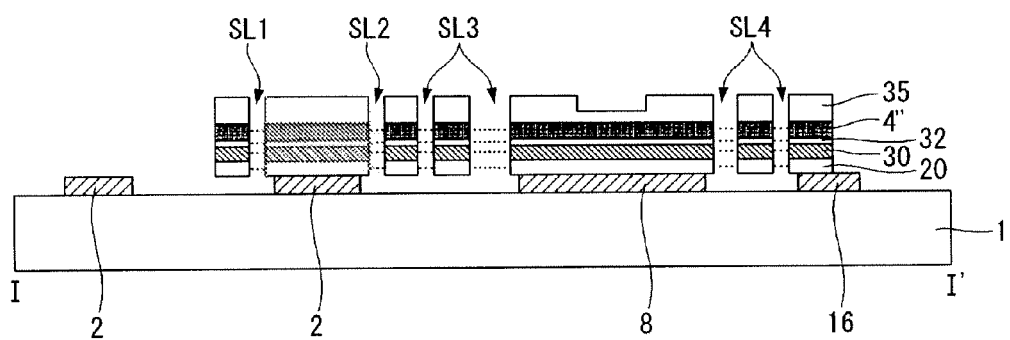
Figure 4:
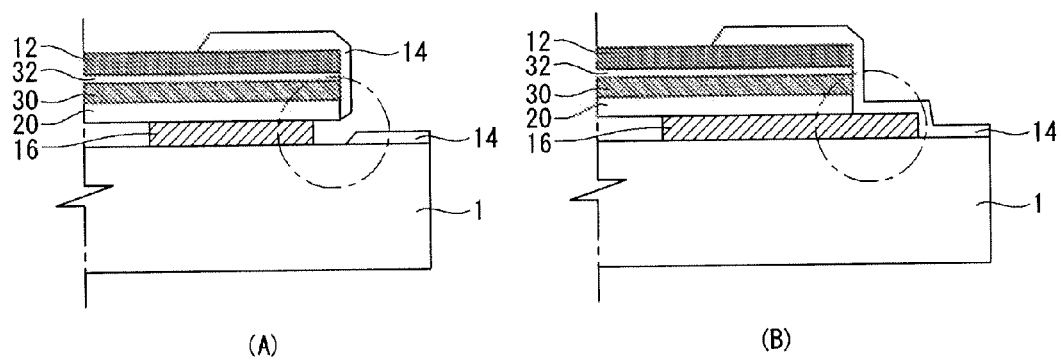
FIG. 4 illustrates a rationale to expose an auxiliary connection pattern.

As shown in FIG. 3C, the entire height level of the first photoresist pattern 35 is reduced to the first level L1 through a first ashing process using O$_2$ plasma. Subsequently, a second wet etching process, a second dry etching process, and the second wet etching process are sequentially performed using the first photoresist pattern 35 having the first height level L1 to expose a portion of the gate lines 2 not overlapping the data lines, a portion of the gate electrodes 8 not overlapping the channels, a portion of the auxiliary connection pattern 16, and the gate pad lower electrode. A rationale to expose the portion of the auxiliary connection pattern 16 is to prevent a disconnection between the pixel electrode 14 and the drain electrode 12 when the pixel electrode 14 is deposited in a subsequent process as shown in FIG. 4(B). If the portion of the auxiliary connection pattern 16 is not exposed as shown in FIG. 4(A), a disconnection occurs between the pixel electrode 14 and the drain electrode 12 may be generated when the pixel electrode 14 is deposited because the auxiliary connection pattern 16 has the undercut structure as shown in FIG. 3B.

Figure 3D:
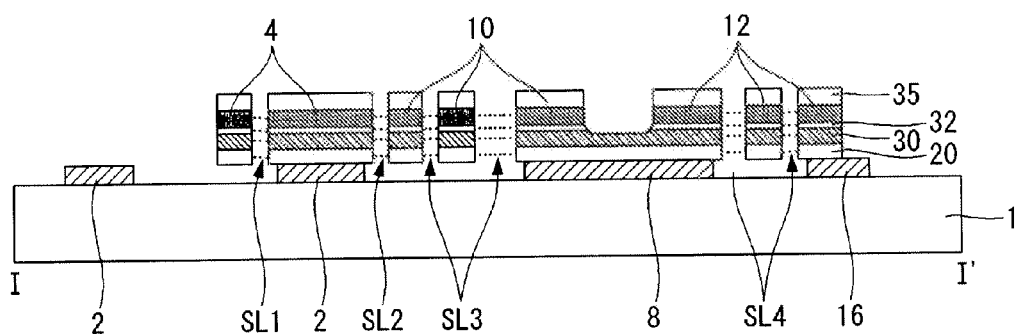

As shown in FIG. 3D, the entire height level of the first photoresist pattern 35 is reduced to the second level L2 through a second ashing process using O$_2$ plasma to remove the first photoresist pattern 35 on the channel. Subsequently, a third wet etching process and a third dry etching process are sequentially performed using the first photoresist pattern 35 having the second height level L2 to etch the second conductive pattern group 4" of the channel and the ohmic contact layer 32. Hence, the active layer 30 of the channel is exposed, and the source electrode 10 and the drain electrode 12 are separated from each other. Subsequently, the first photoresist pattern 35 remaining in the second conductive pattern group 4" is completely removed through a strip process.

Figure 3E:
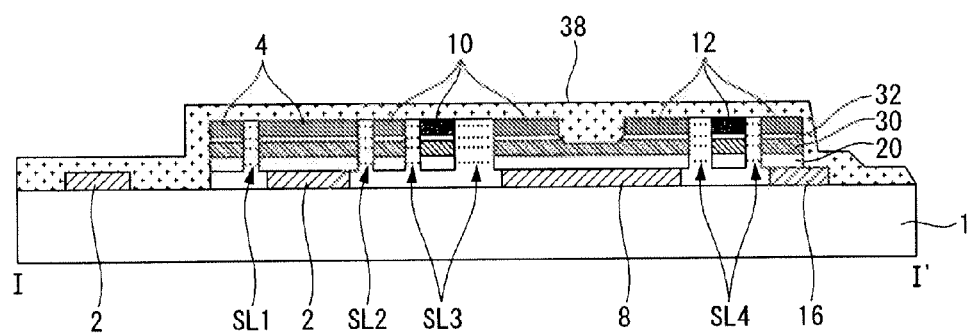
Figure 5:
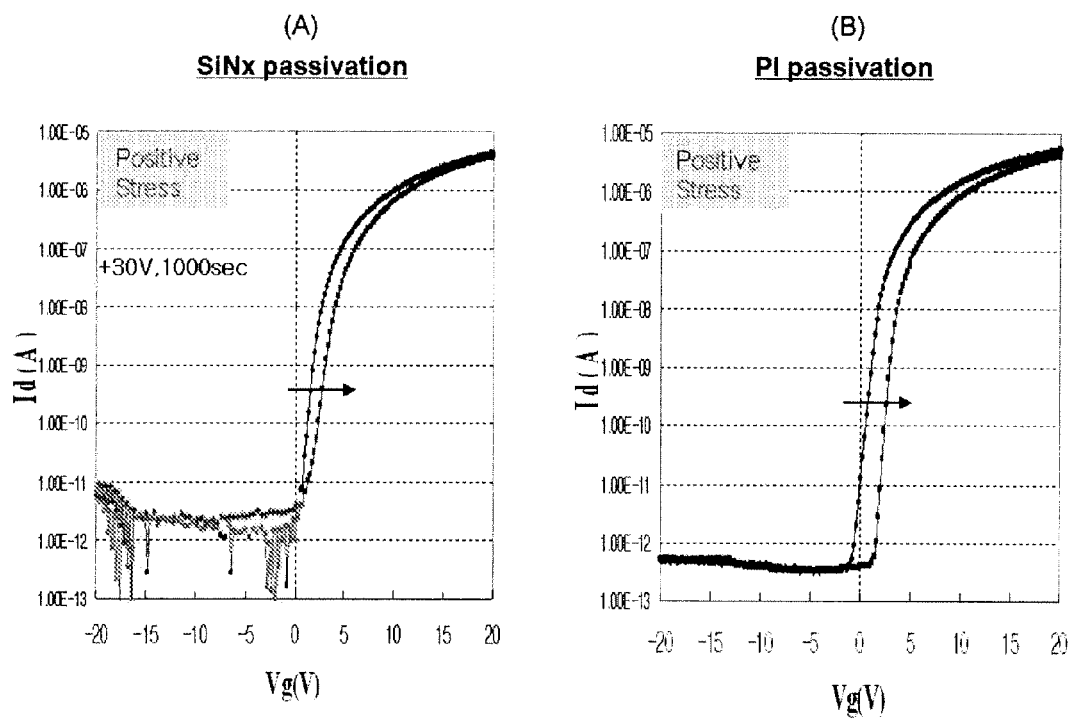
FIG. 5 is a graph illustrating degradation characteristics of a thin film transistor depending on a material of a passivation layer.

As shown in FIG. 3E, a passivation layer 38 is coated on the entire surface of the lower substrate 1 in which the first photoresist pattern 35 is removed using a deposition method such as the PECVD method. The passivation layer 38 may be formed of an inorganic insulating material such as SiNx and SiOx or an organic insulating material such as polyimide. Other materials may be used. The inorganic insulating material is more advantageous than the organic insulating material because of the degradation characteristic of the thin film transistor resulting from a gate bias stress. More specifically, a shift level of a threshold voltage of the thin film transistor resulting from the gate bias stress when the passivation layer 38 formed of SiNx is used as shown in FIG. 5(A) is less than a shift level of a threshold voltage of the thin film transistor resulting from the gate bias stress when the passivation layer 38 formed of polyimide is used as shown in FIG. 5(B). The shift level of the threshold voltage of the thin film transistor is proportional to a degradation degree of the thin film transistor, and the degradation characteristic of the thin film transistor inversely affects the image quality. In FIG. 5, a horizontal axis indicates a voltage Vg applied to the gate electrode of the thin film transistor, and a vertical axis indicates a current Id flowing in the thin film transistor.

Figure 3F:
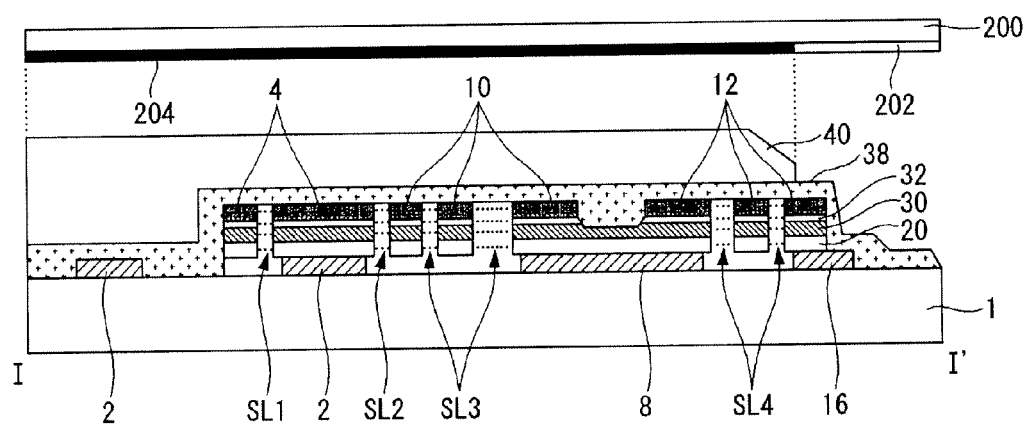

As shown in FIG. 3F, a second photoresist material is coated on the entire surface of the passivation layer. The second photoresist is then patterned through a photolithography process using a second mask 200 to form a second photoresist pattern 40. For this, the second mask 200 includes a transmission unit 202 and a shielding unit 204. In the second mask 200, the second photoresist material corresponding to the transmission unit 202 is removed through an exposure process to expose the passivation layer 38 in the pixel region, the passivation layer 38 on the gate pad lower electrode, and the passivation layer 38 on the auxiliary connection pattern 16. Further, the second photoresist material corresponding to the shielding unit 204 remains.

Figure 3G:
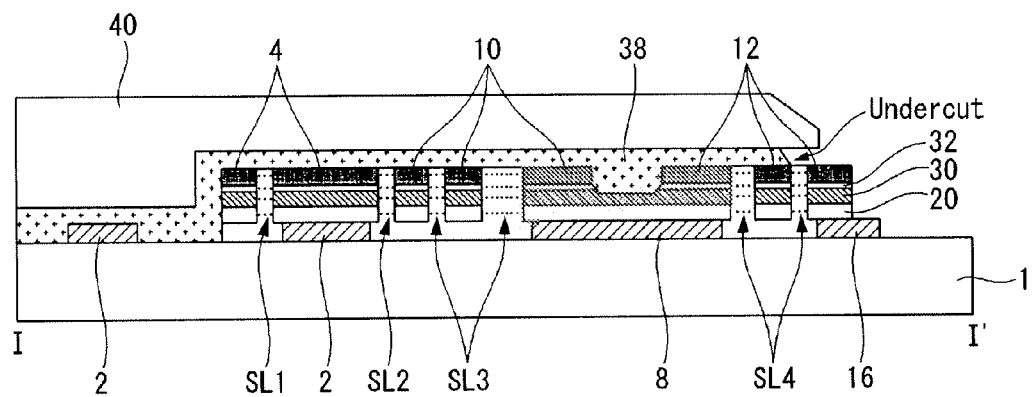

As shown in FIG. 3G, a fourth dry etching process is performed using the second photoresist pattern 40 to remove the exposed passivation layer 38. The passivation layer 38 is over-etched so as to have the undercut structure around the pixel region.

Figure 3H:
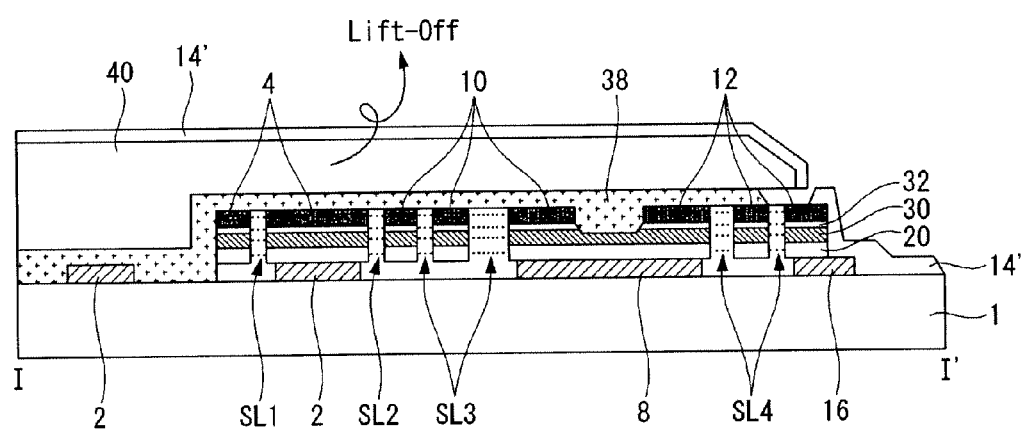

As shown in FIG. 3H, a transparent third conductive material such as ITO, IZO, and TO is coated on the entire surface of the lower substrate 1 including the position in which the passivation layer 38 is partially removed using a deposition method such as the sputtering method. Subsequently, the remaining passivation layer 38 and a third conductive pattern 14' on the remaining passivation layer 38 are removed using a lift-off process.

Figure 3I:
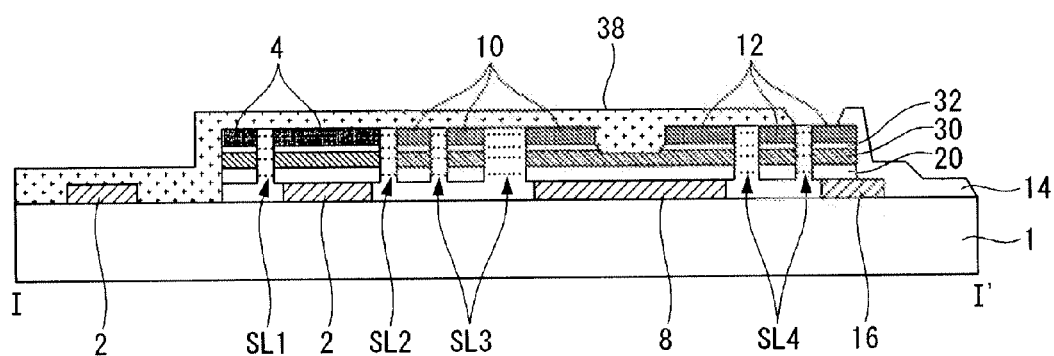

As shown in FIG. 3I, the pixel electrode 14, formed of a transparent material and is connected to the side of the drain electrode 12 and the auxiliary connection pattern 16 in the pixel region and partially overlaps the storage capacitor. Further, the gate pad upper electrode directly connected to the gate pad lower electrode and the data pad upper electrode directly connected to the data pad lower electrode are formed.

As a result, the method of manufacturing the thin film transistor array substrate according to the exemplary embodiment of the invention may be implemented using two photomasks.

Figure 6:
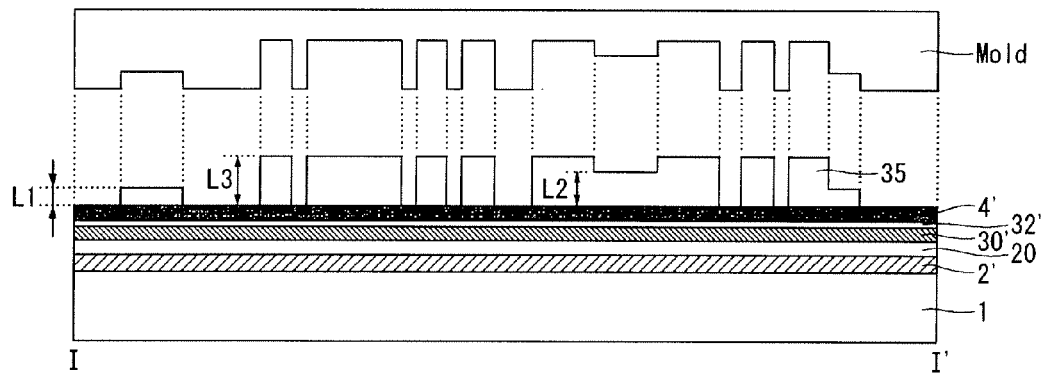
FIG. 6 is a cross-sectional view illustrating the form of a resist pattern having three height levels using an imprinting process.

Further, as shown in FIG. 6, the method of manufacturing the thin film transistor array substrate according to another exemplary embodiment of the invention may form a resist pattern 35 having three height levels L1~L3 through an imprinting process, instead of the photolithography process using a first mask 100 that was discussed above with reference to FIG. 3A. In this alternate embodiment, the thin film transistor array substrate may be manufactured using the mold and only one photomask (i.e., the second mask 200).

As described above, the method of manufacturing the thin film transistor array substrate according to the exemplary embodiment of the invention can be greatly simplified by reducing the number of mask processes (i.e., 2-mask process). As a result, the cost required to manufacture the thin film transistor array substrate can be greatly reduced.

It will be apparent to those skilled in the art that various modifications and variation can be made in the present invention without departing from the spirit or scope of the invention. Thus, it is intended that the present invention cover the modifications and variations of the invention provided they come within the scope of the appended claims and their equivalents.

What is claimed is:

1. A method of manufacturing a thin film transistor array substrate, comprising:
sequentially depositing a first conductive material, a gate insulating layer, a semiconductor layer, and a second conductive material on a substrate;
forming a first resist pattern having three height levels on the second conductive material;
forming a gate line, a data line that crosses the gate line and has first and second slit units, a source electrode connected to the data line and having a third slit unit, and a drain electrode positioned opposite the source electrode with a channel interposed between the source electrode and the drain electrode and having a fourth slit unit, through a plurality of etching processes using the first resist pattern;
depositing a passivation layer on an entire surface of the substrate, including a portion in which the first resist pattern is removed, and then forming a second resist pattern on the passivation layer;
removing the second resist pattern and the passivation layer in a pixel region through an etching process;
depositing a third conductive material on an entire surface of the substrate including the pixel region;
removing the second resist pattern and the third conductive material deposited on the remaining passivation layer through a lift-off process; and
forming a pixel electrode connected to the drain electrode in the pixel region.

2. The method of claim 1, wherein the first and second resist patterns are respectively formed through first and second mask processes.

3. The method of claim 1, wherein the first resist pattern is formed through an imprinting process, and wherein the second resist pattern is formed through a mask process.

4. The method of claim 1, wherein the first conductive material underlying the data line is over-etched through the first and second slit units and is electrically separated from the gate line,
wherein the first conductive material underlying the source electrode is over-etched through the third slit unit and is electrically separated from the gate electrode, and
wherein the first conductive material underlying the drain electrode is over-etched through the fourth slit unit and is electrically separated from the gate electrode.

5. The method of claim 1, wherein the forming of the gate line, the data line, the source electrode, and the drain electrode further includes exposing an auxiliary connection pattern formed of the first conductive material to connect to the pixel electrode.

6. The method of claim 1, wherein the removing of the passivation layer in the pixel region further comprises over-etching the passivation layer underlying the second resist pattern.

7. The method of claim 1, wherein the passivation layer includes one of an inorganic and organic insulating material.

8. The method of claim 1, further comprising forming a storage capacitor that partially overlaps the gate line and has a fifth slit unit, wherein the first conductive material forming the storage capacitor is over-etched through the fifth slit unit and is electrically separated from the gate line.

9. The method of claim 1, further comprising forming a gate pad connected to a gate driver to supply a gate signal to the gate lines.

10. The method of claim 9, wherein the gate pad includes a gate pad lower electrode extending from the gate line, and a gate pad upper electrode directly connected to the gate pad lower electrode, wherein the gate pad upper electrode is formed of the third conductive material.

11. The method of claim 1, further comprising forming a data pad connected to a data driver to supply a data signal to the data line.

12. The method of claim 11, wherein the data pad is formed to include a data pad lower electrode extending from the data line, and a data pad upper electrode directly connected to the data pad lower electrode, wherein the data pad upper electrode is formed of the third conductive material.

13. The method of claim 2, wherein the first mask process includes a half tone mask having a transmission unit, a first transflective unit, a second transflective unit, and a shielding unit, wherein an amount of light transmitted by the first transflective unit is more than an amount of light transmitted by the second transflective unit.

14. The method of claim 13, wherein a first height level of the first resist pattern corresponds to the first transflective unit and is reduced to a first level L1, wherein a second height level of the first resist pattern corresponds to the second transflective unit and is reduced to a second level L2 that is greater than the first level L1, and wherein a third height level of the first resist pattern corresponds to the shielding unit and has a third level L3.

15. The method of claim 2, wherein the second mask process includes a transmission unit and a shielding unit, wherein the second resist pattern corresponding to the transmission unit is removed to expose the passivation layer in the pixel region and on a gate pad lower electrode.

16. The method of claim 1, where the pixel electrode is formed of a transparent material.

* * * * *